United States Patent
Cok

(10) Patent No.: US 7,612,496 B2
(45) Date of Patent: Nov. 3, 2009

(54) OLED DEVICE HAVING IMPROVED POWER DISTRIBUTION

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 746 days.

(21) Appl. No.: 11/311,763

(22) Filed: Dec. 19, 2005

(65) Prior Publication Data

US 2007/0138946 A1 Jun. 21, 2007

(51) Int. Cl.
*H01J 63/04* (2006.01)
(52) U.S. Cl. .................. 313/504; 313/506
(58) Field of Classification Search .......... 313/504, 313/512, 506
See application file for complete search history.

(56) References Cited

U.S. PATENT DOCUMENTS 6,812,637 B2  11/2004  Cok et al.

2001/0004190 A1 * 6/2001 Nishi et al. .................. 313/506
2002/0011783 A1   1/2002 Hosokawa
2004/0253756 A1  12/2004 Cok et al.
2005/0170643 A1 * 8/2005 Fujii et al. .................. 438/637

FOREIGN PATENT DOCUMENTS

JP      2003330377 A  * 11/2003

* cited by examiner

*Primary Examiner*—Toan Ton
*Assistant Examiner*—Hana A Sanei
(74) *Attorney, Agent, or Firm*—Andrew J. Anderson; Raymond L. Owens

(57) ABSTRACT

An organic light-emitting diode (OLED) device, comprising: a first electrode and a second electrode having one or more organic layers formed there-between, at least one organic layer being light-emitting, the first and second electrodes defining one or more light-emissive areas, at least one of the electrodes being transparent; a transparent insulator layer formed adjacent to the transparent electrode opposite the one or more organic layer(s); and one or more reflective, electrically-conductive bus formed in a layer adjacent to the transparent insulator layer opposite the transparent electrode, wherein the reflective, electrically-conductive bus comprises a reflective surface directed towards the light-emitting layer and covers only a portion of the light-emissive areas.

20 Claims, 6 Drawing Sheets

US 7,612,496 B2

OLED DEVICE HAVING IMPROVED POWER DISTRIBUTION

FIELD OF THE INVENTION

The present invention relates to organic light-emitting diode (OLED) devices, and more particularly, to OLED device structures for improving power and signal distribution.

BACKGROUND OF THE INVENTION

Organic light-emitting diodes (OLEDs) are a promising technology for flat-panel displays and area illumination lamps and backlights. Applications of OLED devices include active-matrix image displays, passive-matrix image displays, and area-lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward-biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The organic EL medium structure can be formed of a stack of sublayers that can include small molecule layers or polymer layers. Such organic layers and sublayers are well known and understood by those skilled in the OLED art.

The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device. In any embodiment, however, power is supplied to the electrodes either directly through electricity-carrying busses or through thin-film electronic components powered by such busses. Moreover, in a typical display device, the light emission from an OLED light-emitting element (pixel) varies with time. Since the current necessary to drive the OLED is supplied through the busses, any limitation in the conductivity, capacitance, or inductance of the busses will limit the light emission and switching speed of the pixels.

The OLED materials emit light in proportion to the density of current passed through them. Unfortunately, the OLED materials also age and become less efficient as current is passed through the OLED and light is emitted. One way known in the art to reduce the rate of aging is to reduce the current density, typically by increasing the size of the light-emitting area, sometimes known as the aperture ratio or fill factor. However, the maximum fill factor is limited by the presence of conductive busses and thin-film electronic components, particularly for bottom-emitting devices.

Referring to FIG. 2, a bottom-emitting OLED known in the prior art is illustrated having a transparent substrate 10. Over the substrate 10, a semiconducting layer is formed providing thin-film electronic components 30 for driving an OLED. Components 30 are connected to current and signal distribution busses 19. An interlayer insulating and planarizing layer 32 is formed over the thin-film electronic components 30 and busses 19, and a patterned transparent electrode 12 defining OLED light-emissive areas 50 is formed over the insulating layer 32. An inter-pixel insulating film 34 separates the elements of the patterned transparent electrode 12. One or more first layers 14 of organic material, one of which emits light, are formed over the patterned transparent electrode 12. A reflective second electrode 16 is formed over the one or more first layers 14 of organic material. A gap separates the reflective second electrode 16 from an encapsulating cover 20. The encapsulating cover 20 may be coated directly over the reflective electrode 16 so that no gap exists. The thin-film electronic components 30 are driven by current and signal distribution busses 19 provided between light emissive areas 50 to conduct electrical power and signals from external device controllers (not shown) to the electrodes 12 and 16. However, since busses 19 are positioned between light emissive areas 50, the size and conductivity of busses 19 is limited by the desired aperture ratio of the emissive area, limiting the amount of current and switching rate of the OLED device.

Referring to FIG. 3, a top view of a simplistic, prior-art layout on a substrate 10 includes an emissive area 50, thin-film electronic components 30 for driving the electrodes, and signal and current busses 19 for providing power and signals to the thin-film electronic components 30. The relative sizes and spacing of the various elements in the device is typically defined by the requirements of the manufacturing process; this example is illustrative only and presumes that the resolution and spacing requirements of the various components is constant. The manufacturing process may define, for example, the resolution and spacing of the light-emitting area 50, the busses 19, and the size of the thin-film electrical components 30. If the size of the busses 19 is increased, thereby improving the signal and power distribution in the device, the size of the light-emitting areas 50 is decreased, thereby increasing the current density of the driving currents in the OLED (at a constant brightness) and reducing the lifetime of the materials. If the size of the light-emitting areas 50 is increased, thereby decreasing the current density of the driving currents in the OLED (at a constant brightness) and increasing the lifetime of the materials, the remaining area for the busses 19 is decreased, thereby reducing the effectiveness of the signal and power distribution in the device.

There is a need, therefore, for an improved OLED device structure that improves the power and signal distribution over the OLED device without decreasing the lifetime of the OLED materials in the OLED device.

SUMMARY OF THE INVENTION

In accordance with one embodiment, the invention is directed towards an organic light-emitting diode (OLED) device, comprising: a first electrode and a second electrode having one or more organic layers formed there-between, at least one organic layer being light-emitting, the first and second electrodes defining one or more light-emissive areas, at least one of the electrodes being transparent; a transparent insulator layer formed adjacent to the transparent electrode opposite the one or more organic layer(s); and one or more reflective, electrically-conductive bus formed in a layer adjacent to the transparent insulator layer opposite the transparent electrode, wherein the reflective, electrically-conductive bus comprises a reflective surface directed towards the light-emitting layer and covers only a portion of the light-emissive areas.

ADVANTAGES

Various embodiments of the present invention have advantages of improving the power and signal distribution over the OLED device while increasing the relative size of the emissive area, thereby improving OLED lifetime.

It will be understood that the figures are not to scale since the individual layers are too thin and the thickness differences of various layers too great to permit depiction to scale.

DETAILED DESCRIPTION OF THE INVENTION

Figure 1:
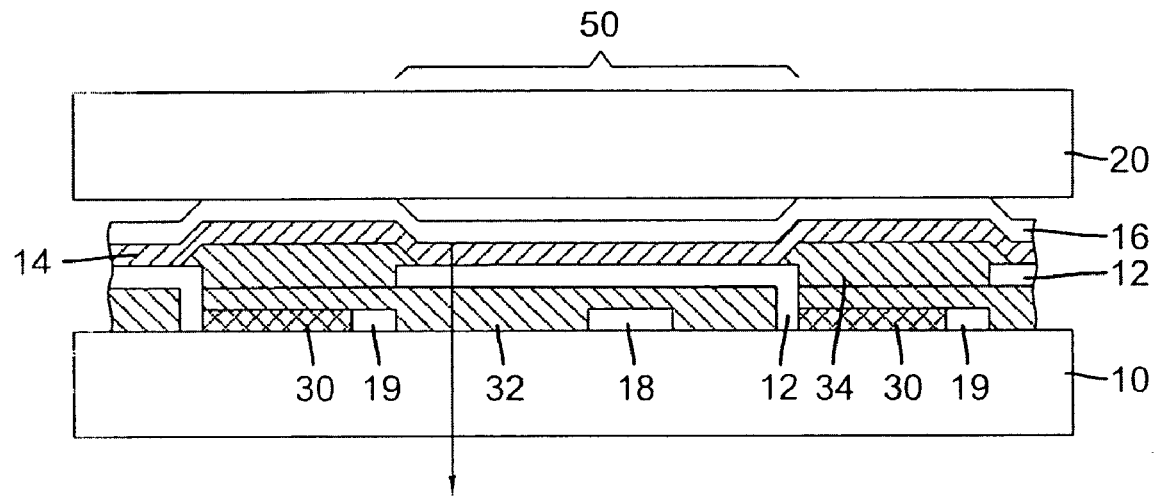
FIG. 1 is a partial cross section of a bottom-emitter OLED device according to an embodiment of the present invention.
Figure 2:
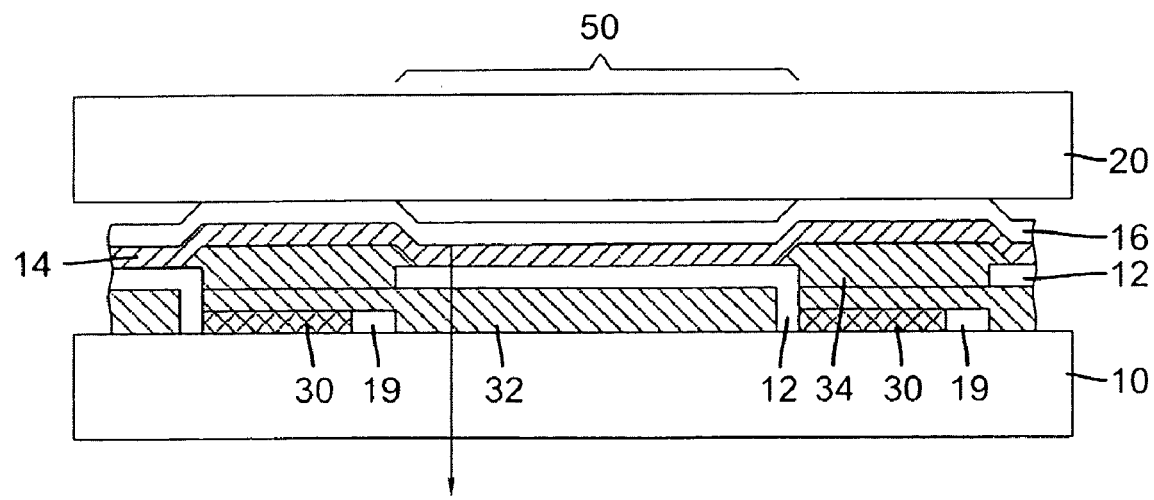
FIG. 2 is a partial cross section of a prior-art bottom-emitter OLED device.
Figure 3:
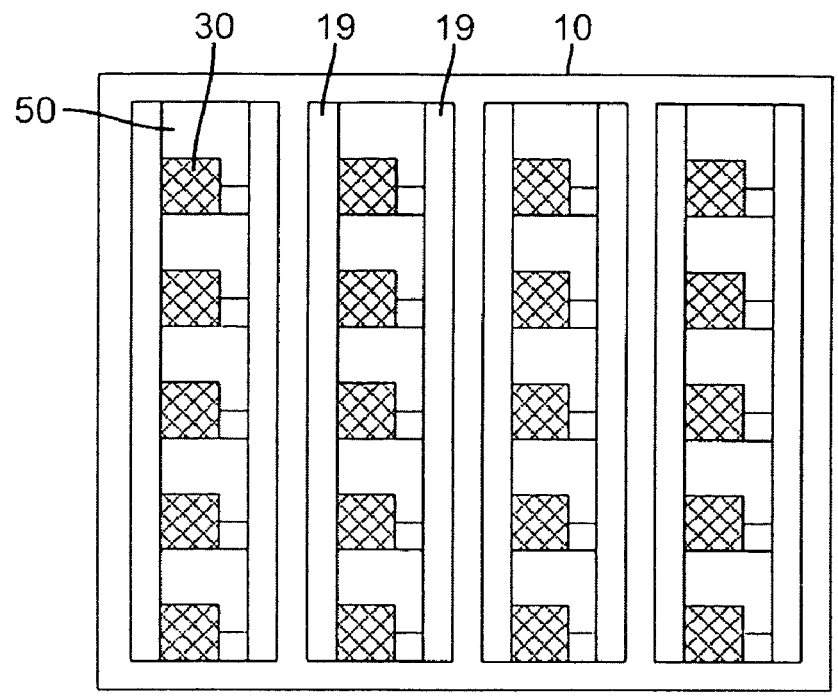
FIG. 3 is a top-view of a bottom-emitter OLED device layout as known in the prior art.

Referring to FIG. 1, in one bottom-emitting embodiment of the present invention, an organic light-emitting diode (OLED) device comprises a first electrode 12 and a second electrode 16 having one or more organic layers 14 formed there-between, at least one organic layer 14 being light-emitting, the first and second electrodes 12 and 16 defining one or more light-emissive areas 50, at least electrode 12 being transparent; a transparent insulator layer 32 formed adjacent to the transparent electrode 12 opposite the one or more organic layer(s) 14; and a reflective, electrically-conductive bus 18 formed in a layer adjacent to the transparent insulator layer 32 opposite the transparent electrode 12, wherein the reflective, electrically-conductive bus comprises a reflective surface directed towards the light-emitting layer and covers only a portion of the light-emissive area 50. In this embodiment, the first electrode 12 and the substrate 10 are transparent and the second electrode 16 is reflective. The first electrode 12 may be patterned to form individual light-emitting areas 50. The transparent insulating layer 32 may also be a planarization layer.

The OLED device is formed over a substrate 10. A semi-conducting layer is formed providing thin-film electronic components 30 for driving the OLED. The interlayer insulating and planarizing layer 32 is formed over the thin-film electronic components 30 and the patterned transparent electrode 12 defining OLED light-emissive areas 50 is formed over the transparent insulating layer 32. An inter-pixel insulating film 34 separates the elements of the patterned transparent electrode 12. A gap may separate the reflective second electrode 16 from an encapsulating cover 20. Alternatively, the encapsulating cover 20 may be coated directly over the reflective electrode 16 so that no gap exists.

Figure 4:
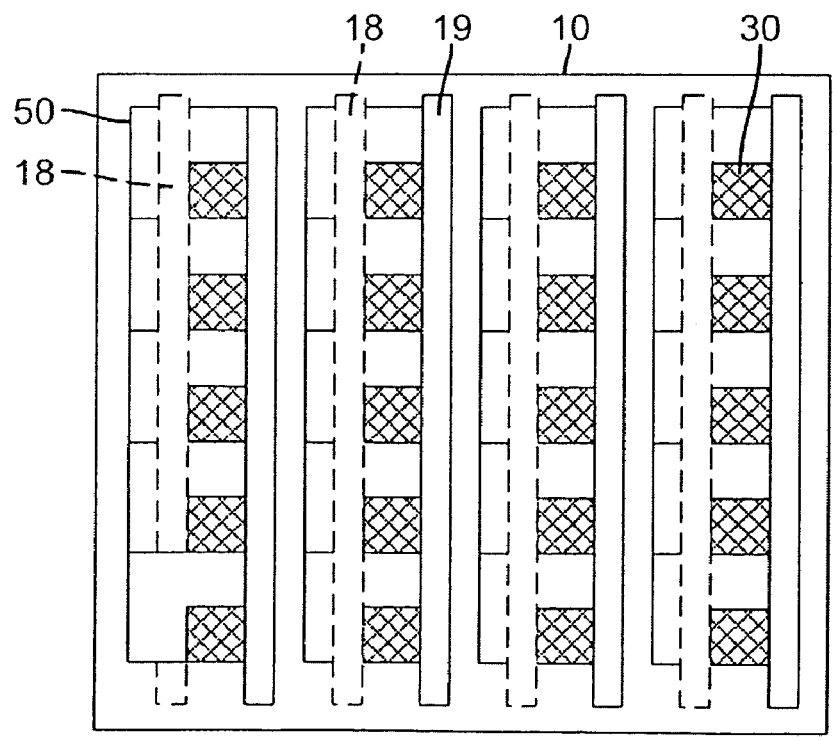
FIG. 4 is a top-view of a bottom-emitter OLED device layout according to an embodiment of the present invention.

Referring to FIG. 4 in a top view of an embodiment of the present invention, the thin-film electronic components 30 are driven by current and signal distribution busses 19 and a reflective, electrically-conductive bus 18 covering only a portion of the light-emissive area 50. According to the present invention, the total light-emissive area 50 defined by patterned electrode 12 (including the area obscured by the reflective, electrically-conductive bus 18) is larger than would otherwise be the case if busses 19 and 18 were both formed between light-emissive areas 50, thereby reducing the driving current density in the OLED material in a light emissive area 50 and increasing the lifetime of the OLED device. As shown in FIG. 4, the reflective, electrically-conductive bus 18 covers only a portion of the light-emitting area 50 so that light may be emitted from the remaining portion of the light-emitting area on either side of the reflective, electrically-conductive bus 18.

Figure 5:
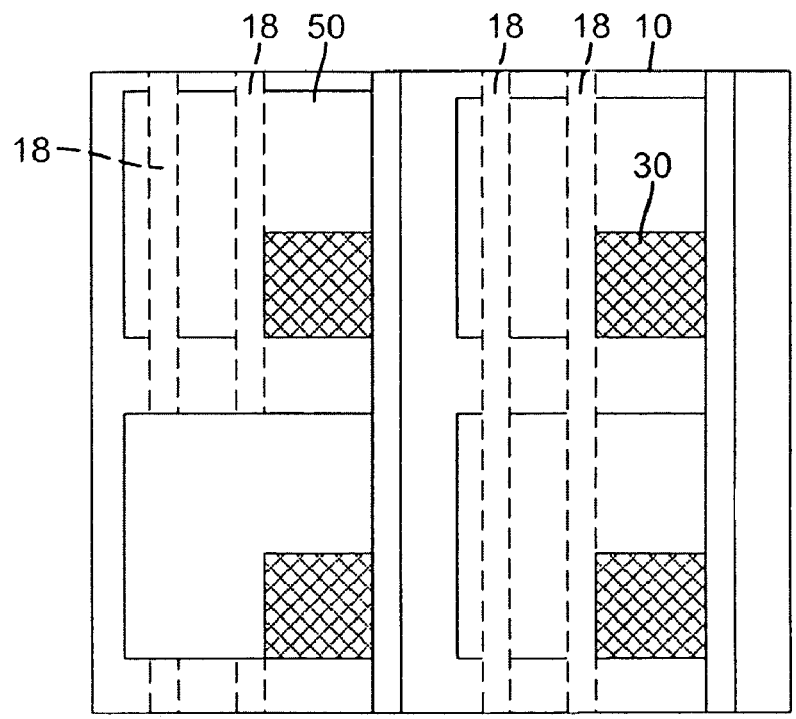
FIG. 5 is a top-view of a bottom-emitter OLED device layout according to an alternative embodiment of the present invention.
Figure 6:
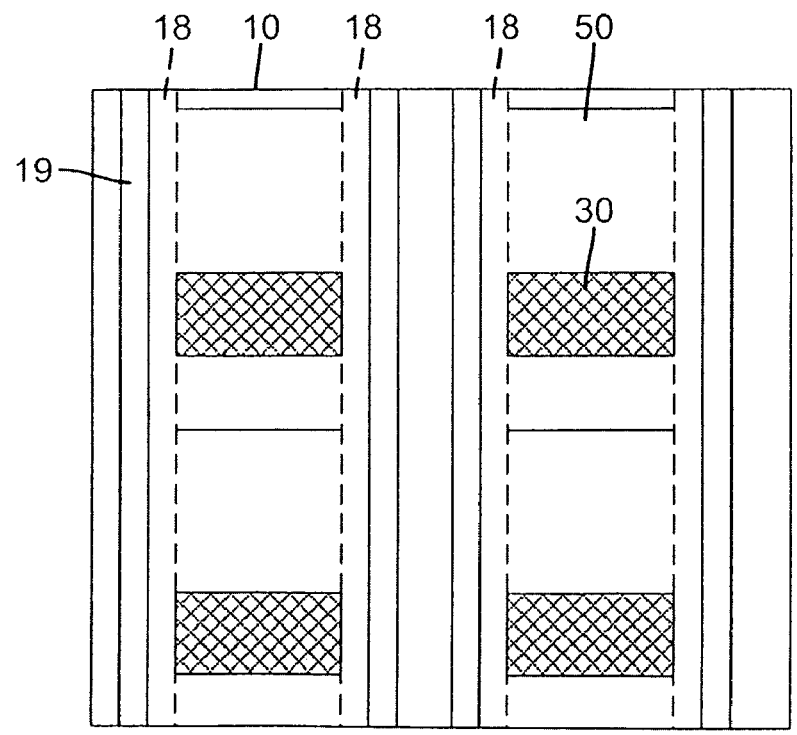
FIG. 6 is a top-view of a bottom-emitter OLED device layout according to another embodiment of the present invention.

According to various embodiments of the present invention, the reflective, electrically-conductive bus 18 may be positioned in a variety of locations, comprise any of a variety of reflective, conductive materials (e.g. silver, aluminum, magnesium or other metals or metal alloys), and have various widths as defined by the manufacturing process used to manufacture the OLED device. The transparent electrode 12 may comprise a metal oxide, for example indium tin oxide (ITO) as is known in the art. In particular, referring to FIG. 5, one or more reflective, electrically-conductive busses 18 may be employed in various embodiments of the present invention and may carry a variety of signals, for example power, data, or select signals as are known in the flat-panel display art. As illustrated in FIGS. 4 and 5, busses 18 may be positioned such that portions of the light emissive area 50 not covered by the reflective electrically-conductive bus are located on more than one side of the reflective, electrically-conductive bus. Referring to FIG. 6, the reflective, electrically-conductive busses 18 may alternatively be located at the edge of the light-emitting area 50 and may be only partially over the light-emitting area 50. In this arrangement, a bus 19 is essentially contiguous with a reflective electrically-conductive bus 18 and electrically connected to it. In other embodiments (not shown), a bus 19 may be partially contiguous with a reflective electrically-conductive bus 18 over a portion of its length. According to other various embodiments of the present invention, the reflective, electrically-conductive busses 18 may be formed in a common step and/or comprise common materials as other busses 19 employed in the OLED device, thereby reducing mask steps and manufacturing costs.

Figure 7:
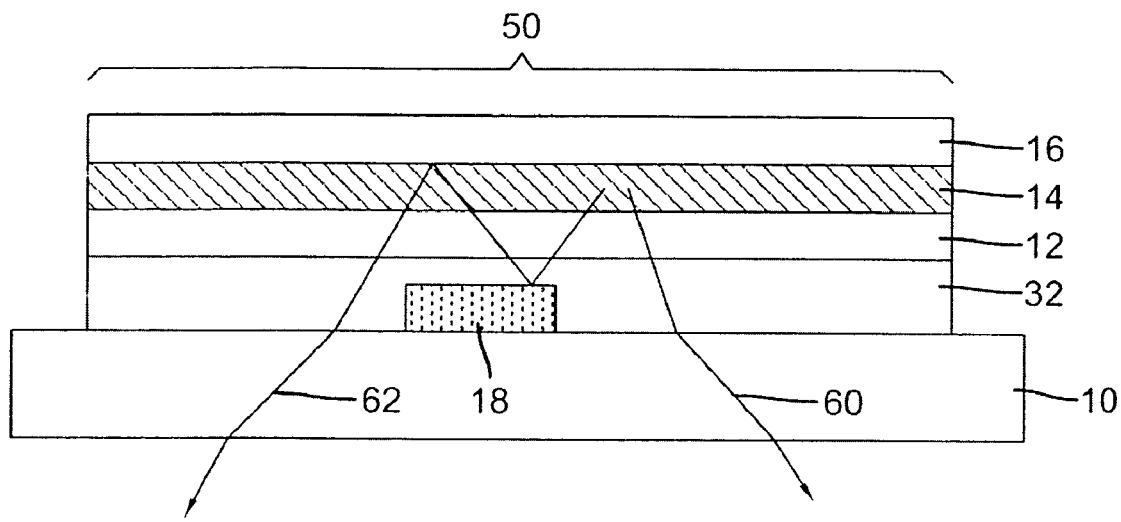
FIG. 7 is a partial cross section of a bottom-emitter OLED device illustrating the path of light rays according to an embodiment of the present invention.
Figure 8:
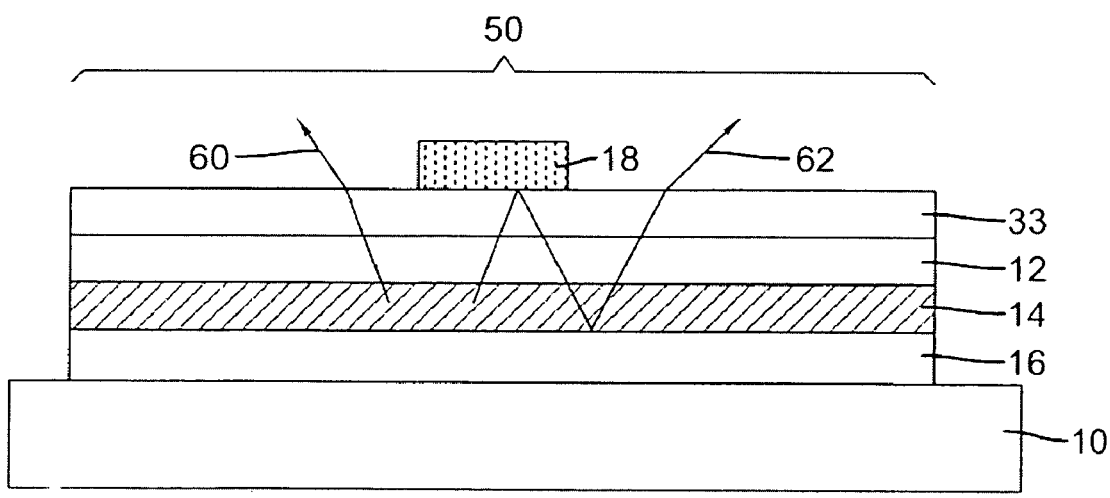
FIG. 8 is a partial cross section of a top-emitter OLED device illustrating the path of light rays according to another embodiment of the present invention.

Upon the provision of signals and power through the busses 18 and 19, the thin-film electrical components 30 apply a voltage-differential across the electrodes 12 and 16, causing a current to flow through the OLED material layer(s) 14 and light to be emitted in light-emitting area 50. The light is emitted in all directions, but (referring to FIG. 7), some of the light is emitted toward the reflective bus 18. Because the bus 18 is reflective in accordance with the present invention, the light is reflected from it back toward the reflective electrode 16 whence it may be re-directed out of the OLED device or strike the reflective bus 18 a second time. Because both a reflective electrode 16 and bus 18 are formed opposite each other, all emitted light may pass out of the OLED device so that no light is lost (except through absorption by imperfectly reflecting surfaces). Hence, the present invention enables an increased fill factor for light-emitting area corresponding to patterned electrode 12 for the OLED device, since the light emitted from the light-emitting area behind the bus 18 can still escape from the OLED device, thereby improving the lifetime of the OLED materials. Referring to FIG. 8, a top-emitting version of the present invention includes a reflective electrode 16 located adjacent to the substrate 10 and the transparent electrode 12 on the side of the light-emitting layer(s) 14 opposite the reflective electrode 16 and substrate 10. A transparent insulating layer 33 separates the reflective, electrically-conductive bus 18 from the electrode 12. The layer 33 may be formed using different materials and processes than the corresponding, bottom-emitter insulating layer 32 since the layer 33 will be typically formed over the OLED and electrode layers 12, 14, and 16 rather than on the substrate 10. In operation, the embodiment of FIG. 8 is similar to that of FIG. 7.

Applicants have constructed a top-emitting version of the present invention and demonstrated that light can indeed be reflected from current-carrying metal layers formed over a transparent insulator in the light-emitting areas so that light emitted from behind the reflective, electrically-conductive bus 18 is usefully emitted from the OLED device.

Figure 9:
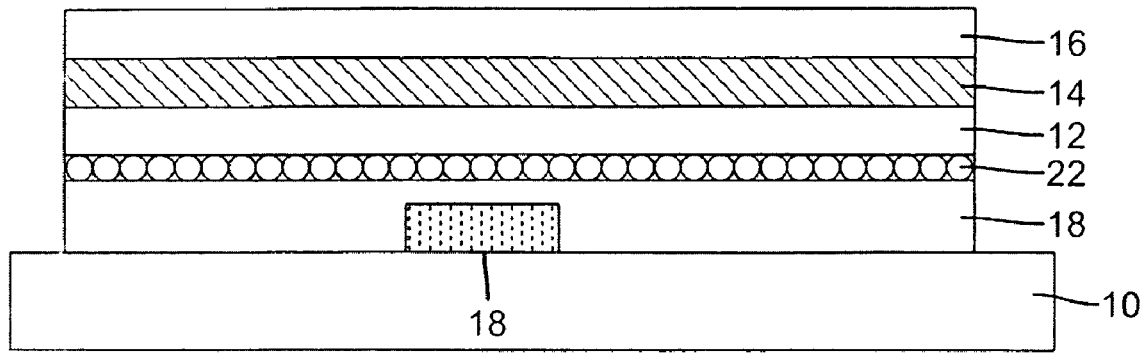
FIG. 9 is a partial cross section of a bottom-emitter OLED device incorporating a scattering layer according to an embodiment of the present invention.

In alternative further embodiments of the present invention, referring to FIG. 9, a scattering layer 22 may be optically integrated with the electrodes 12 and 16 respectively and the organic layers 14. As described in co-pending, commonly assigned U.S. Ser. No. 11/065,082, filed Feb. 24, 2005, the disclosure of which is hereby incorporated by reference, light emitted by the organic layers of an OLED may be trapped within the OLED device and a scattering layer may be employed to scatter the trapped light out of the OLED device. As employed herein, a light scattering layer 22 is an optical layer that tends to randomly redirect any light that impinges on the layer from any direction. Optically integrated means that light emitted by the organic layers 14 encounters the scattering layer 22 before traveling through other layers having an optical index lower than those of the organic materials or electrodes. The scattering layer 22 may be positioned in a variety of locations that are optically coupled to the light-emitting organic material layers 14. For example, the scattering layer 22 may be located between the transparent insulating layer and the transparent electrode 12, as shown in FIG. 9. Alternatively, a scattering layer 22 may be located between the reflective, electrically-conductive bus 18 and the transparent insulating layer (not shown). In another embodiment illustrated in FIG. 10, the surface 40 of a reflective, electrically-conductive bus 18' may itself be light scattering, for example by employing a rough surface. Moreover, a reflective surface of the reflective electrically-conductive bus that is not parallel to one or more of the electrodes may be employed so that fewer reflections may be necessary for light emitted from behind the reflective, electrically-conductive bus 18 to escape from the OLED device of the present invention.

Figure 10:
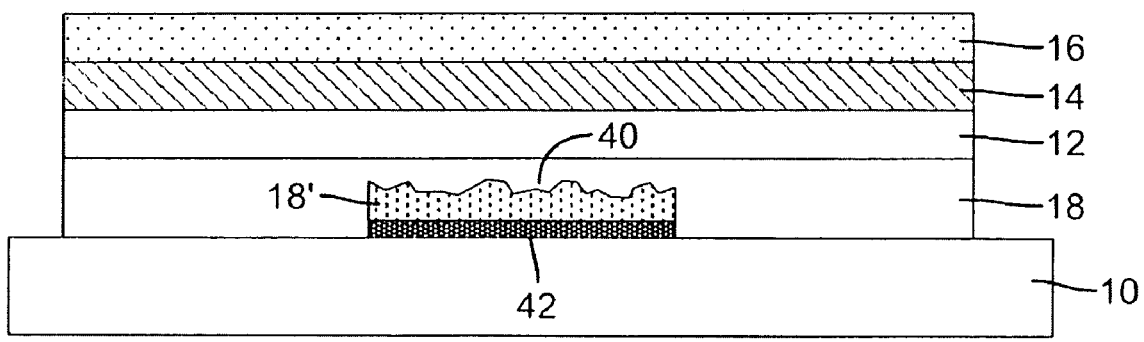
FIG. 10 is a partial cross section of a bottom-emitter OLED device incorporating a scattering reflective electrically-conductive bus according to an alternative embodiment of the present invention.

It is also useful to improve the contrast of the OLED device by reducing ambient reflections from the various components in the device. According to another embodiment of the present invention and as illustrated in FIG. 10, the reflective electrically-conductive bus 18 has a light-absorbing side 42 opposite the transparent electrode 12 in addition to reflective side 40 directed towards the transparent electrode 12.

Figure 11:
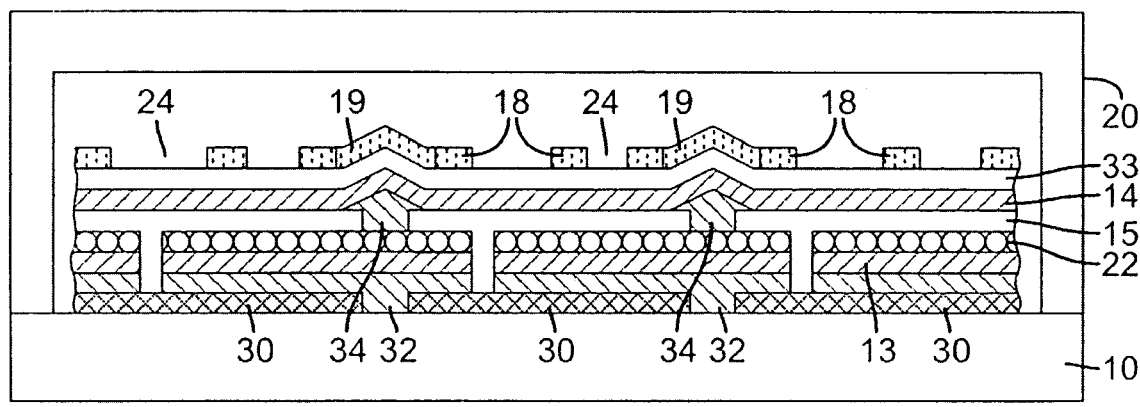
FIG. 11 is a partial cross section of a top-emitter OLED device incorporating a scattering layer and low-index element according to an other embodiment of the present invention.

In a top-emitter embodiment shown in FIG. 11, the scattering layer 22 is located between a transparent conductor 15 and a reflector 13. A low-index gap 24 is formed between the reflective, electrically-conductive bus 18 and over the transparent insulating layer 33. The low-index gap 24 preserves the sharpness of the OLED device as is taught in U.S. Ser. No. 11/065,082 referenced above. Applicants have demonstrated the efficacy of the scattering layer 22 for extracting light and the low-index gap 24 in preserving sharpness within the present invention.

Although OLED layer structures have been primarily described with a cathode on the top and an anode on the bottom near the substrate, it is well known that the organic layers can be inverted and the positions of the anode and cathode exchanged. Both such structures are included in the present invention.

Various conductive and scattering materials useful in the present invention, as well as the employment of scattering layers for extracting additional light from the device are further described in co-pending, commonly assigned U.S. Ser. No. 11/065,082, filed Feb. 24, 2005, incorporated by reference above. Additional layers may be usefully employed with the present invention. For example, one problem that may be encountered with scattering layers is that the electrodes may tend to fail open at sharp edges associated with the scattering elements in the scattering layer. Although the scattering layer may be planarized, typically such planarizing operations do not form a perfectly smooth, defect-free surface. To reduce the possibility of shorts between the transparent electrodes, a short-reduction layer may be employed over a scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned US2005/0225234, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation. Atomic layer deposition may be employed to provide encapsulation, for example as described in copending, commonly assigned U.S. Ser. No. 11/122,295, filed Apr. 5, 2005, the disclosure of which is incorporated by reference herein. These encapsulation layers may be formed over the transparent electrode either under or over any of the scattering layers or color filter layers. For example, a protective layer, for example an encapsulating layer formed by atomic layer deposition and/or a layer of parylene, may be formed over the transparent electrode 12.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
12 transparent electrode
13 reflective layer
14 organic layer(s)
15 transparent electrode
16 reflective electrode
18, 18' reflective bus
19 bus
20 cover
22 scattering layer
24 low-index element
30 thin-film circuitry
32 transparent insulator
33 transparent insulator
34 insulator
40 reflective surface
42 light-absorbing surface
50 light-emitting area
60, 62 light ray

The invention claimed is:

1. An organic light-emitting diode (OLED) device, comprising:
   a first electrode and a second electrode having one or more organic layers formed there-between, at least one organic layer being light-emitting, the first and second electrodes defining one or more light-emissive areas, at least one of the electrodes being transparent;
   a transparent insulator layer formed adjacent to the transparent electrode opposite the one or more organic layer(s); and
   one or more reflective, electrically-conductive bus formed in a layer adjacent to the transparent insulator layer opposite the transparent electrode, wherein the reflective, electrically-conductive bus comprises a reflective surface directed towards the light-emitting layer and covers only a portion of the light-emissive areas.

2. The organic light-emitting diode (OLED) device of claim 1, wherein the OLED device is a bottom-emitter further comprising a transparent substrate, and wherein the reflective bus, transparent insulator, transparent electrode, organic layer(s), and other electrode are formed in that order on the transparent substrate, and wherein the other electrode is a reflective electrode.

3. The organic light-emitting diode (OLED) device of claim 1, wherein the OLED device is a top-emitter further comprising a substrate, and wherein the other electrode, organic layer(s), transparent electrode, transparent insulator, and reflective bus are formed in that order on the substrate, and wherein the other electrode is a reflective electrode.

4. The organic light-emitting diode (OLED) device of claim 1, wherein the reflective electrically-conductive bus is a power bus connected to an electrode through a via in the transparent insulating layer.

5. The organic light-emitting diode (OLED) device of claim 1, further comprising a transistor formed on a substrate and wherein the reflective electrically-conductive bus is a signal or power bus connected to a terminal of the transistor.

6. The organic light-emitting diode (OLED) device of claim 5, wherein the reflective electrically-conductive bus is a data signal or a select signal bus.

7. The organic light-emitting diode (OLED) device of claim 1, comprising a plurality of reflective electrically-conductive busses adjacent the transparent insulator opposite the transparent electrode and in combination covering only a portion of the light-emissive area.

8. The organic light-emitting diode (OLED) device of claim 1, wherein the reflective electrically-conductive bus comprises a metal or metal alloy.

9. The organic light-emitting diode (OLED) device of claim 8, wherein the reflective electrically-conductive bus comprises aluminum, silver, or magnesium or alloys including aluminum, silver, or magnesium.

10. The organic light-emitting diode (OLED) device of claim 1, further comprising one or more electrically-conductive busses formed in areas between the light emissive areas.

11. The organic light-emitting diode (OLED) device of claim 10, wherein the one or more electrically-conductive busses formed in areas between the light emissive areas are formed in a common step with the reflective electrically-conductive bus covering a portion of the light-emissive areas.

12. The organic light-emitting diode (OLED) device of claim 10, wherein the one or more electrically-conductive busses formed in areas between the light emissive areas are electrically connected to the reflective electrically-conductive bus covering a portion of the light-emissive areas.

13. The organic light-emitting diode (OLED) device of claim 1, comprising a plurality of light-emissive areas and wherein the reflective electrically-conductive bus covers a portion of each of the plurality of light-emissive areas.

14. The organic light-emitting diode (OLED) device of claim 1, wherein the transparent insulating layer is a planarization layer.

15. The organic light-emitting diode (OLED) device of claim 1, wherein the transparent electrode comprises a metal oxide.

16. The organic light-emitting diode (OLED) device of claim 1, further comprising a scattering layer located between the reflective electrically-conductive bus and the transparent electrode.

17. The organic light-emitting diode (OLED) device of claim 1, wherein the reflective surface of the reflective electrically-conductive bus is light scattering.

18. The organic light-emitting diode (OLED) device of claim 1, wherein portions of the light emissive area not covered by the reflective electrically-conductive bus are located on more than one side of the reflective, electrically-conductive bus.

19. The organic light-emitting diode (OLED) device of claim 1, wherein the reflective electrically-conductive bus has a reflective side facing the transparent electrode and a light-absorbing side opposite the transparent electrode.

20. The organic light-emitting diode (OLED) device of claim 1, wherein the reflective surface of the reflective electrically-conductive bus is not parallel to one or more of the electrodes.

* * * * *